United States Patent
Magnusson et al.

(10) Patent No.: US 9,645,186 B2
(45) Date of Patent: May 9, 2017

(54) LOOSE PLUG DETECTION

(71) Applicant: VOLVO CAR CORPORATION, Gothenburg (SE)

(72) Inventors: Anders Magnusson, Uppsala (SE); Mats Nilsson, Kungsbacka (SE)

(73) Assignee: Volvo Car Corporation, Gothenburg (SE)

( * ) Notice: Subject to any disclaimer, the term of this patent is extended or adjusted under 35 U.S.C. 154(b) by 77 days.

(21) Appl. No.: 14/272,528

(22) Filed: May 8, 2014

(65) Prior Publication Data
US 2014/0354295 A1    Dec. 4, 2014

(30) Foreign Application Priority Data

May 30, 2013    (EP) .................................... 13169866

(51) Int. Cl.
*G01R 31/04* (2006.01)
*B60L 3/00* (2006.01)
(Continued)

(52) U.S. Cl.
CPC ............ *G01R 31/04* (2013.01); *B60L 3/0023* (2013.01); *B60L 3/0069* (2013.01); *B60L 3/04* (2013.01);
(Continued)

(58) Field of Classification Search
CPC .. Y02T 90/14; Y02T 10/7005; B60L 2250/10; B60L 3/12; B60L 3/0023;
(Continued)

(56) References Cited

U.S. PATENT DOCUMENTS 5,625,539 A * 4/1997 Nakata ................ H02M 7/4807
 363/132
6,646,419 B1 * 11/2003 Ying .................. G01R 31/3668
 320/132
(Continued)

FOREIGN PATENT DOCUMENTS

EP    2515411 A1    10/2012
WO    2011120793 A1    10/2011
(Continued)

OTHER PUBLICATIONS

Extended European Search Dated Nov. 27, 2013, Application No. 13169866A-1809—Applicant Volvo Car Corporation, 6 Pages.

*Primary Examiner* — Son Le
*Assistant Examiner* — Akm Zakaria
(74) *Attorney, Agent, or Firm* — Brooks Kushman P.C.

(57) ABSTRACT

According to the disclosure there is provided a method for characterizing an electrical connection between an energy storage device of an electrical or hybrid vehicle and an external power supply. The method may include, in the vehicle, receiving an alternating waveform from the power supply, determining a fundamental frequency of the waveform, determining if the waveform is distorted, and, if it is determined that the waveform is distorted, determining if the distortion is an indication of a loose connection between the vehicle and the power supply. There is further provided a charging system for characterizing an electrical connection between an energy storage device of an electrical or hybrid vehicle and an external power supply.

12 Claims, 4 Drawing Sheets

(51) Int. Cl.
*B60L 3/04* (2006.01)
*B60L 3/12* (2006.01)
*B60L 11/18* (2006.01)

(52) U.S. Cl.
CPC .............. *B60L 3/12* (2013.01); *B60L 11/1818* (2013.01); *B60L 2250/10* (2013.01); *Y02T 10/7005* (2013.01); *Y02T 10/7072* (2013.01); *Y02T 90/14* (2013.01)

(58) Field of Classification Search
CPC ...... B60L 3/04; B60L 3/0069; B60L 11/1818; G01R 31/04
USPC ........................................................ 324/538
See application file for complete search history.

(56) References Cited

U.S. PATENT DOCUMENTS

| | | | | |
|---|---|---|---|---|
| 2003/0030448 | A1* | 2/2003 | Sapir .................... | H02H 1/0015 324/536 |
| 2010/0079105 | A1* | 4/2010 | Iwanaga ................ | B60K 6/445 320/109 |
| 2010/0253145 | A1* | 10/2010 | King ...................... | B60L 1/006 307/46 |
| 2010/0268406 | A1* | 10/2010 | Ito ........................ | B60L 3/0023 701/22 |
| 2011/0127956 | A1* | 6/2011 | Mitsutani ............... | B60K 6/365 320/109 |
| 2011/0320056 | A1 | 12/2011 | Brown et al. | |
| 2012/0007553 | A1* | 1/2012 | Ichikawa ............ | B60L 11/1816 320/109 |
| 2013/0100982 | A1 | 4/2013 | Gase et al. | |
| 2014/0152261 | A1* | 6/2014 | Yamauchi ........... | B60L 11/1866 320/118 |

FOREIGN PATENT DOCUMENTS

| | | |
|---|---|---|
| WO | 2012028176 A1 | 3/2012 |
| WO | 2012107820 A2 | 8/2012 |

* cited by examiner

LOOSE PLUG DETECTION

CROSS-REFERENCE TO RELATED APPLICATIONS

This application claims foreign priority benefits under 35 U.S.C. §119(a)-(d) to European patent application number EP 13169866.4 filed May 30, 2013, which is incorporated herein by reference in its entirety.

TECHNICAL FIELD

The present disclosure relates to an electrical connection between a power supply and an electric or hybrid vehicle. In particular, the present disclosure relates to the operational status of such a connection.

BACKGROUND

Electric and hybrid vehicles have recently become a more common sight on roads worldwide. They have one thing in common and that is they all require a large and powerful rechargeable battery. Despite the size of such batteries mounted in e.g. electric vehicles, they need to be recharged almost every day, depending on how frequently and how far the vehicle is driven.

The power required from a power source in order to recharge a rechargeable battery of an electric vehicle is substantial. This puts some requirements on the performance of cables and connectors of the entire charging system. A concern is the risk of e.g. a faulty connection, a broken cable or a loose connection which may be a hazard for a user. A faulty connection may cause an increase in electrical resistance between a power outlet and a cable connected between the power outlet and the battery. The increased electrical resistance causes an increase in temperature and the charging system may thus become a fire hazard.

For conventional charger systems there is commonly a dedicated cable with an integrated temperature sensor for detecting an increased temperature. However, such cables involve high complexity and are unnecessarily expensive.

WO2012107820 discloses a charging system capable of detecting a state of a connection of a charging cable for an electric or hybrid vehicle by measuring a voltage across reference resistors and comparing the measured voltage to a threshold voltage to determine a state of the connection. The charging cable of this system comprises a number of components required for analyzing the connection state of the cable to the vehicle. Although the disclosed system does not rely on a temperature measurement, it still requires a special and complicated cable. In particular, the system disclosed in WO2012107820 comprises a connection detection device included in the connector of the charging system.

SUMMARY

In view of the above, it is a general object of the present disclosure to provide an improved method for detecting a loose connection in a system using an arbitrary cable suitable for charging of an electric or hybrid vehicle. There is also provided a charging system in a vehicle for detecting a loose connection.

According to a first aspect it is therefore provided a method for characterizing an electrical connection between an energy storage device of an electrical or hybrid vehicle and an external power supply, the method comprising the steps of: in the vehicle, receiving an alternating waveform from the power supply; determining a fundamental frequency of the waveform; determining if the waveform is distorted; and if it is determined that the waveform is distorted, determining if the distortion is an indication of a loose connection between the vehicle and the power supply.

A loose connection may be any type of faulty, discontinuous, interrupted, or incomplete connection between an external power supply and a power inlet of an electrical or hybrid vehicle. The loose connection may for example be due to a cable connector or plug which may be badly fitted with the power inlet or outlet, or it may be the result of a faulty cable, for example a cable having a defect conductor resulting in a loose electrical connection.

The fundamental frequency of the current waveform may for example be 50 Hz or 60 Hz as conventionally used for household applications, or it may be any other frequency of the waveform supplied by the external power supply. The amplitude may be for example 220 Volts or 110 Volts.

The present disclosure is based on the realization that a loose connection may lead to a certain distortion on a waveform passing through the loose connection, and that the distortion can be analyzed to determine if it is a result of a loose connection. Such a waveform may be represented as a current, voltage or power waveform, which can be seen as equivalents in the present application. For clarity, the term current waveform will be used as an example herein. First, the current waveform is detected and analyzed in order to determine whether a distortion is present or not. If a distortion is detected, and further depending on the nature of the detected distortion, it may be determined that the distortion is due to a loose connection. Thereby, a loose connection may be detected using an arbitrary cable in a charging system. Furthermore, according to the present disclosure it is possible to detect a loose connection at the point of connection between the cable and the vehicle, something which may not be possible if the means for detecting a loose connection are arranged in the cable itself.

By analyzing the current waveform, different types of distortions may be distinguished from each other. This enables for example evaluating and identifying the source of an error, or evaluating the risk associated with a distortion. Thereby, it can also be determined if the distortion is hazardous and/or if it may damage the charging system or the energy storage. Furthermore, distortions which normally occur on a power grid, which are not results of a loose connection, can be identified. Thereby, as the method according to the present disclosure is able to separate different types of distortions, the amount false indications of a loose connection resulting from other types of distortions can be reduced.

According to an embodiment of the disclosure, the method may further comprise identifying a transient of the waveform, and if the transient has a slope different from a slope of the waveform at the fundamental frequency, determine that the transient is an indication of a loose connection. A transient may be a rapidly changing portion of the waveform. Identifying a transient is advantageous because it may indicate a typical loose connection. It may further be advantageous because a transient may be distinguished from the waveform. The slope is the change in amplitude of the waveform as a function of time, and the slope may either be a positive or a negative slope.

According to an embodiment of the disclosure, the method may further comprise identifying a pulse of the waveform having a rising flank and a falling flank, and determining that the pulse is a result of a loose connection if the rising flank and the falling flank occurs within a predetermined time interval shorter than a half period of the fundamental frequency. Pulses, or glitches, resulting from a loose connection are typically faster than the fundamental frequency. Thereby, pulses can be identified as resulting from a loose connection if they are significantly faster than the fundamental frequency of the waveform, such as if they occur within a time period shorter than half a period of the fundamental frequency. This may advantageously also distinguish a distortion coming from a loose connection from other types of distortions. Furthermore, the number of detected pulses within a predetermined time period may also give an indication of the severity of a distortion. The rising flank may arrive before the falling flank or vice versa, i.e. the pulse may be positive or negative in relation to the fundamental waveform. A flank may define a leading edge or a back edge of a pulse.

According to one embodiment of the disclosure, the method may further comprise identifying a plurality of pulses of the waveform, each pulse having a rising flank and a falling flank, and determining that the plurality of pulses is a result of a loose connection if more than a predetermined number of the pulses are indentified within a predetermined time interval. The predetermined time interval may be for example a half period of the waveform.

According to one embodiment of the disclosure, the method may further comprise determining, if the waveform comprises a frequency component higher in frequency than the fundamental frequency of the waveform, that the frequency component is an indication of a loose connection. If a frequency of the incoming waveform is different from the fundamental frequency, it is determined that the waveform is distorted. For example, the amplitude of the waveform of the current supplied from the power supply may drop for a short period of time, or there may be a complete or near complete drop-out of supplied voltage. Furthermore, there may be an overvoltage on the power supply resulting in a voltage swell, such as increased amplitude of the waveform, or there may be glitches on a power network supplying power to the power supply. In the context of the disclosure, the above-mentioned distortions may come from the power supply itself or from the power network providing power to the power supply. The above-mentioned distortions may further come one by one or in any combination. The distortions may further be caused by defects on the cable or connectors on a cable transporting the current waveform. The step of identifying frequency components is advantageous because it may allow separation of distortions not related to a loose connection from distortions that may be derived from a loose connection. For example, a drop-out voltage or a voltage swell should not be interpreted as a distortion resulting from a loose connection. The detected frequency may have a higher frequency than the fundamental frequency such as an overtone. For example, in case of a loose connection, a high amplitude glitch may be a distortion. Such a glitch may comprise a high frequency component higher than the fundamental frequency, which is a known indication of a loose connection. Accordingly, a detected frequency component higher than the fundamental frequency may be determined to be an indication of a loose connection.

According to one embodiment of the present disclosure, the method may further comprise integrating a portion of the waveform; determining an average amplitude of the integrated portion; and if a difference between the average amplitude exceeds a reference amplitude it is determined that the waveform is distorted as a result of a loose connection. This is advantageously used for identifying a loose connection and distinguishing it from other distortions. A portion of the waveform may be a predetermined time interval such as a number of periods of the waveform, or a continuous integration of the waveform may be performed.

According to one embodiment of the present disclosure, the method may further comprise sampling the waveform at a predefined sampling frequency. This is advantageous for further processing of the waveform. A predefined sampling frequency may be several kHz, or several tens of kHz, or for example 100 kHz. Sampling of the waveform is further advantageous because it may enable for example comparing adjacent samples in order to identify distortions, such as a transient resulting from a loose connection by analyzing the difference in amplitude between adjacent samples. In a sampled waveform, a portion of the waveform may be defined as a predefined number of sampled points of the waveform. The predefined number of points may be an equivalent of for example a half period of the waveform or a quarter period of the waveform.

According to one embodiment of the present disclosure, the method may further comprise providing an alert signal if a magnitude of a distortion resulting from a loose connection exceeds a first threshold value. A magnitude is here referred to as a combination of the duration of a distortion and the amplitude of the distortion. For example, a low amplitude distortion being significantly lower than the amplitude of the waveform may be allowed for e.g. a full period of the fundamental frequency or longer before an alert is provided whereas a high amplitude distortion such as e.g. a voltage exceeding the maximum output voltage of the power supply may only be allowed for a short period of time such as a fraction of a millisecond before an alert is provided. This is advantageous because it allows a convenient way to determine if a presence of distortion from a loose connection may cause a hazard. For example, if there are only a few distortions due to a loose connection over a period of time, it may only be necessary to alert a user without taking any further actions. Using a period, or a number of periods, of the fundamental frequency as a time reference for determining a magnitude of a distortion may be advantageous because it is a time reference which is already determined by the system, thus no further input to the system would be needed.

In various embodiments of the disclosure, the method may further comprise electrically disconnecting the power supply from the energy storage device if a magnitude of a distortion resulting from a loose connection exceeds a second threshold value. This way, if a distortion from a loose connection having a magnitude exceeding a second threshold value is detected, it may be determined that it is suitable to disconnect the power supply from the energy storage device. This is advantageous because the method may determine to, in the vehicle, disconnect the power supply from the energy storage device if it is determined that the distortions due to a loose connection may cause a hazard, either to the charging system or to the energy storage device.

According to various embodiments of the present disclosure, the method may further comprise a step of logging a detected distortion if the distortion is determined to be the result of a loose connection. This is advantageous because it allows diagnosing the loose connection. It also allows performing statistical analysis of the loose connections such as how often they occur etc. For example, systematic or regular distortions may indicate an error on the power grid or in the charging system, and random or irregular distortions may be indicative of a loose connection.

According to a second aspect of the present disclosure, there is provided a system in a vehicle for characterizing an electrical connection between an energy storage device of an electrical or hybrid vehicle and an external power supply, the system comprising: a control unit receiving an alternating current waveform from the power supply, the control unit being configured to determine a fundamental frequency of the waveform, a relay unit arranged to receive the current waveform from the power supply and, depending on a control signal received from the control unit, configured to control a supply of the current waveform from the power supply to the energy storage device, and a rectifier unit, connected between the relay unit and the energy storage device, configure to receive the current waveform from the relay unit, rectify the current waveform, and to deliver the rectified current to the energy storage device; wherein the control unit is configured to detect a distortion of the waveform, and to determine if a detected distortion is an indication of a loose connection between the vehicle and the power supply.

A part of the functions of the system may also be provided by a so called power factor correction (PFC) unit. Such a unit corrects and, if required, converts a supplied current waveform to follow a desired waveform. In a PFC an analog-to-digital converter (ADC) converts the current waveform and supplies the digital signal to a control unit, e.g. a microprocessor.

An ADC may for example comprise a resistance ladder arranged to convert and scale down the current waveform. In the present disclosure, the control unit controls the supply of power from the external power supply to the energy storage device by controlling a relay connected between the power supply and the energy storage device. The relay may typically be provided in the form of a semiconductor switch. However, the relay unit may equally be provided in the form of any electromechanical switch known by the person skilled in the art. Typically, a rectifier is arranged between the energy storage device and the relay for rectifying an AC-waveform provided by the power supply into a suitable direct current to the energy storage device, where the energy storage device may be a rechargeable battery.

The control unit may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device.

The system may further comprise additional rectifier bridges and filters, such as high-pass or low-pass filters, or converters without limiting the functionality of the system.

According to one embodiment of the present disclosure, the control unit may further be configured to identify a transient of the waveform, and if the transient has a slope different from a slope of the waveform at the fundamental frequency, to determine that the transient is an indication of a loose connection.

According to one embodiment of the present disclosure, the control unit may further be configured to identify a pulse of the waveform having a rising flank and a falling flank, and to determine that the pulse is a result of a loose connection if the rising flank and the falling flank occurs within a predetermined time interval shorter than a half period of the fundamental frequency.

According to one embodiment of the present disclosure, the control unit may further be configured to identify a plurality of pulses of the waveform, each pulse having a rising flank and a falling flank, and to determine that the plurality of pulses are a result of a loose connection if more than a predetermined number of the pulses are indentified within a predetermined time interval.

According to one embodiment of the present disclosure, the system may further comprise a high-pass filter arranged to receive the current waveform from the power supply, the high-pass filter being configured to block frequencies equal to or lower than the fundamental frequency and to provide a resulting filtered signal to the control unit; wherein the control unit is configured to determine an average amplitude of the filtered signal, and to determine that the received current waveform is distorted as a result of a loose connection if the average amplitude of the filtered signal exceeds a predetermined threshold value. This way, frequency components having a frequency below a certain threshold are blocked before they reach the control unit. Frequency components higher in frequency than a predefined threshold are allowed to pass the filter and be received by the control unit. Distortions coming from a loose connection may comprise frequency components above the predetermined threshold. A distortion from a loose connection may therefore comprise a rapidly changing amplitude. A difference between amplitudes of the waveform at frequencies passing the filter may therefore indicate a distortion indicative of a loose connection. Thus, this may be used to detect a distortion as a result of a loose connection. As an example, the amplitude may be zero, i.e. the case where the received waveform does not comprise any frequency components other than the fundamental frequency. Thereby, any filtered signal which has a detectable amplitude may be an indication of a loose connection. Furthermore, a low-pass or band-pass filter may be used instead of or in combination with the high-pass filter in order to eliminate frequencies higher than the fundamental frequency, but which does not indicate a loose connection. Such frequencies may for example comprise known overtones of the fundamental frequency or ripple.

According to an embodiment of the present disclosure, the system further comprising an analog-to-digital converter configured to convert an analog alternating current waveform received from the power supply into a digital waveform using a predefined sampling frequency, and to provide the digital waveform to the control unit. A predefined sampling frequency may be several kHz, or several tens of kHz, or for example 100 kHz. Distortions coming from a loose connection may comprise frequency components above the predetermined threshold. A distortion from a loose connection may therefore comprise rapidly changing amplitude. A difference between amplitudes of adjacent samples at frequencies passing the filter may therefore indicate a distortion indicative of a loose connection. Thus, this may be used to detect a distortion as a result of a loose connection.

The control unit may comprise a storage device configured to store an indication of a detected distortion if the distortion is determined to be the result of a loose connection. The use of a storage device may be advantageous as it enables diagnosing of a loose connection. It also enables performing statistical analysis of the loose connections such as how often they occur etc. For example, systematic or regular distortions may indicate an error on the power grid, and random distortions may be indicative of a loose connection.

Further effects and features of this second aspect of the present disclosure are largely analogous to those described above in connection with the first aspect of the disclosure.

BRIEF DESCRIPTION OF THE DRAWINGS

These and other aspects of the present disclosure will now be described in more detail, with reference to the appended drawings showing a currently preferred embodiment of the disclosure, wherein.

DETAILED DESCRIPTION

Figure 1:
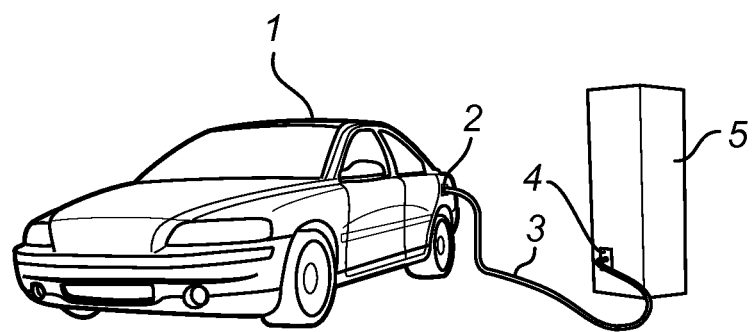
FIG. 1 schematically shows an exemplary application for an exemplary embodiment of a system and for a method according to an embodiment of the disclosure.

As required, detailed embodiments of the present disclosure are presented herein. However, it is to be understood that the disclosed embodiments are merely exemplary of the disclosure that may be embodied in various and alternative forms. The figures are not necessarily to scale, and some features may be exaggerated or minimized to show details of particular components. Therefore, specific structural and functional details disclosed herein are not to be interpreted as limiting, but merely as a representative basis for teaching one skilled in the art to variously employ the present disclosure.

The figures are schematic and simplified for clarity and merely show details for understanding the disclosure. Throughout the disclosure the same reference numerals have been used to represent identical or corresponding parts.

In the following description, the present disclosure is mainly described with reference to a method for characterizing an electrical connection between an external power supply providing an alternating current and a battery of an electrical or hybrid vehicle, and to a charging system in such a vehicle. In the description, a waveform in the form of an alternating current waveform is described. However, current may equally well be replaced by voltage or power in the below description.

FIG. 1 illustrates an exemplary application of the present disclosure. In, FIG. 1, an electric vehicle 1 is connected at its power inlet 2 via a charging cable 3 to an external power supply 4. The external power supply 4 may for example be located at a charging station 5 for electric vehicles or it may be connected to a conventional domestic power outlet. The power supplied by the power supply may for example be 220 V at 50 Hz via a one-phase output. The charging cable 3 can therefore be a regular power cord that may or may not comprise any further components such as temperature sensors.

Figure 2:
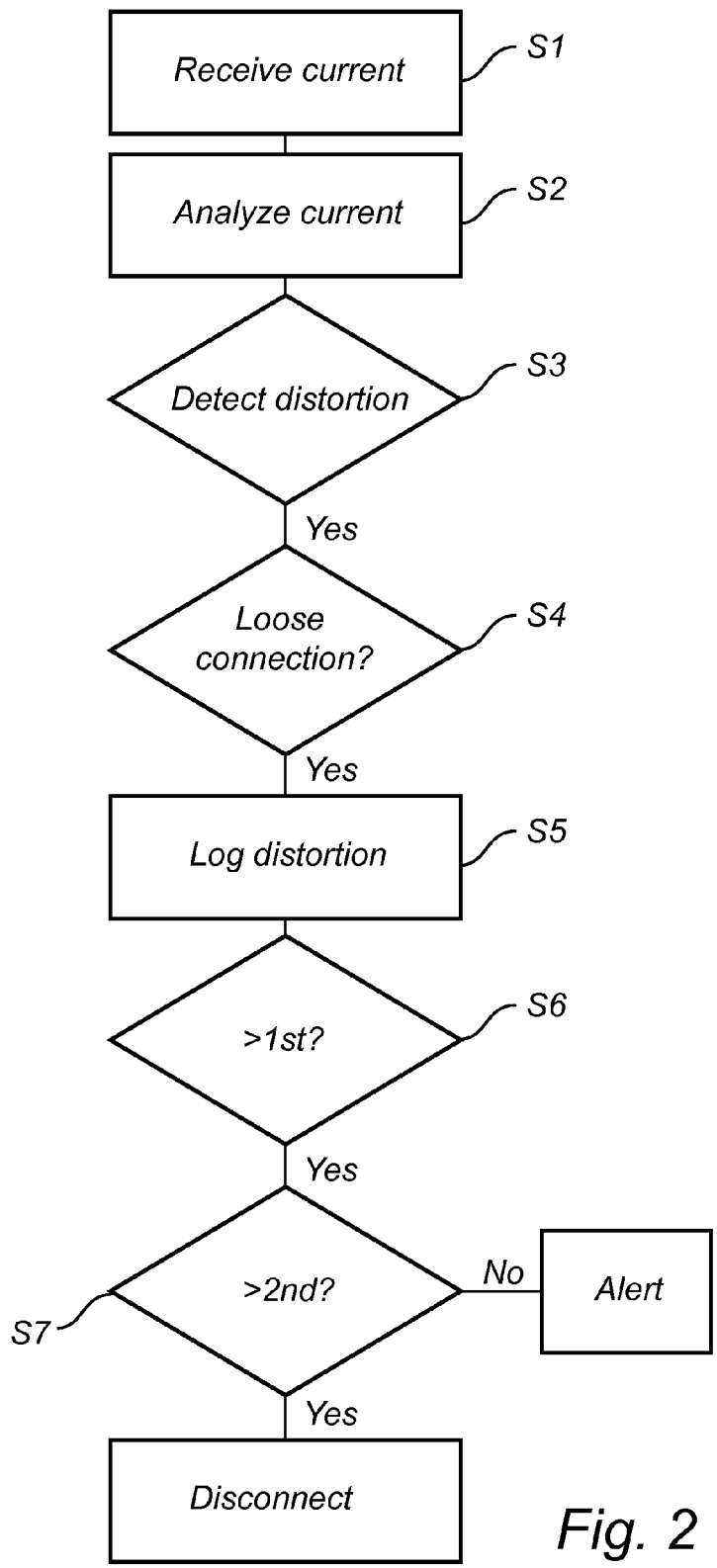
FIG. 2 is a flow-chart illustrating a method according to an exemplary embodiment of the disclosure.

FIG. 2 shows a flow chart schematically illustrating the method according to an embodiment of the present disclosure. In a first step S1, an alternating current waveform is received by the vehicle from a power supply. In a second step S2, the received waveform is analyzed. In this step, properties such as frequency and amplitude of the waveform are determined, unless such properties are already know through information provided by a user or by an external application. In a next step S3, it is determined if the waveform is distorted. In this step, it is determined that the waveform is distorted if a frequency is different from a fundamental frequency determined in step S2, or if transients or pulses deviating from the fundamental frequency are detected.

Figure 3A:
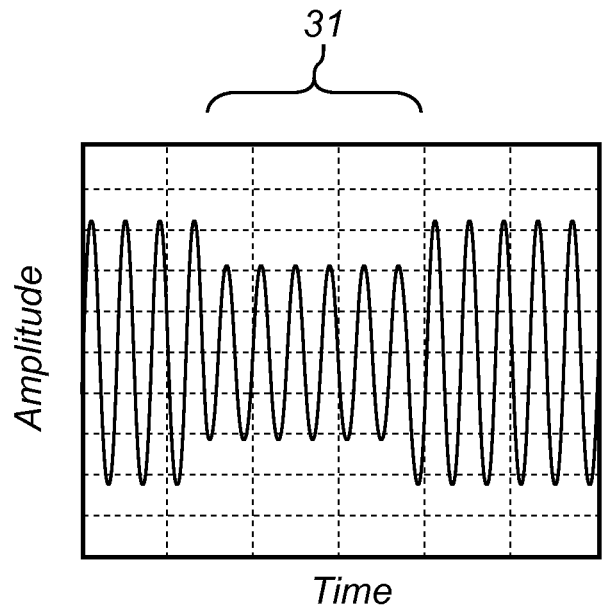
FIGS. 3a, 3b and 3c illustrate exemplary distortions of a waveform.
Figure 3B:
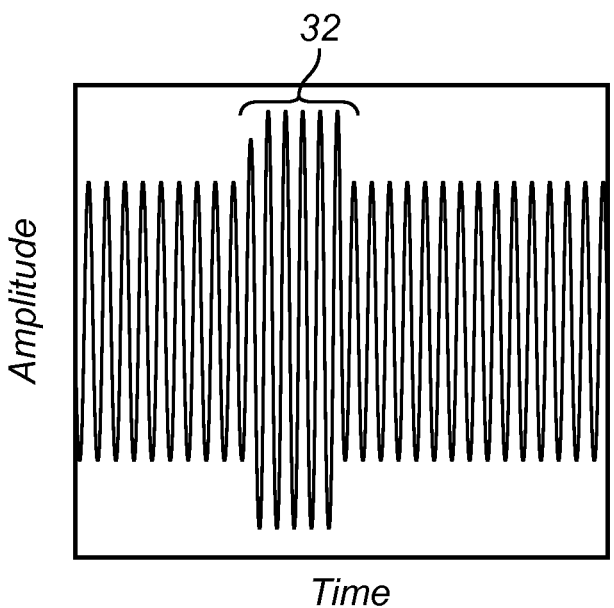
Figure 3C:
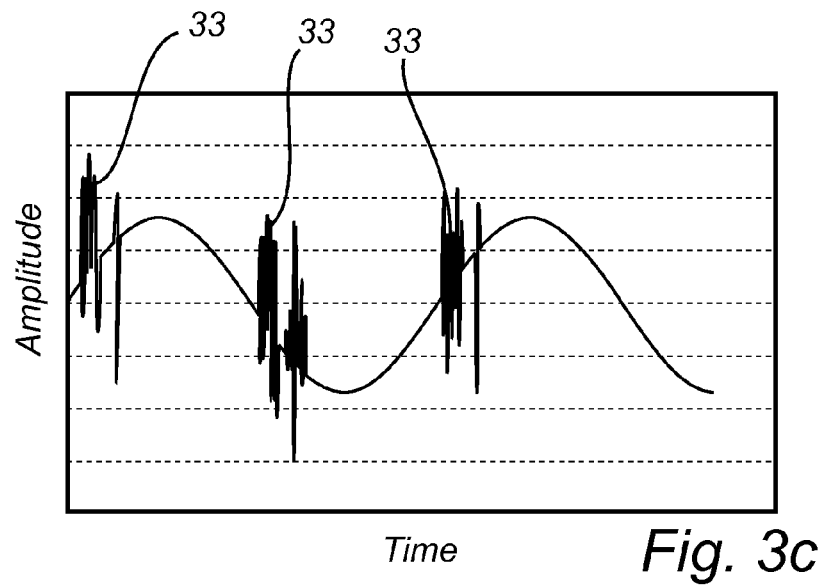

For example, FIG. 3a shows an example of a distortion 31 that causes the amplitude of the waveform to drop for a short time period. In FIG. 3b, a voltage swell 32 is illustrated. In FIG. 3b the distortion 32 takes the form of a briefly increased amplitude. The distortions illustrated in FIGS. 3a-b are distortions which may be commonly occurring on a conventional power grid. Such distortions are generally not damaging or otherwise hazardous to the charging system of a vehicle. FIG. 3c on the other hand illustrates a typical distortion of a current waveform resulting from a loose connection. In this case, the glitches 33 on the waveform are typical indications of a loose connection. If a distortion is detected, it is determined in a subsequent step S4 if the distortion is likely to have been caused by a loose connection. This step S4 is performed for example by determining if the distortion comprises a frequency component with a frequency higher than the fundamental frequency. For example, if the fundamental frequency is 50 Hz and a frequency component of 1 MHz is detected, it is determined that the distortion is caused by a loose connection. Normally a glitch related to a loose connection has a rise/fall time which corresponds to frequencies in the MHz range. Accordingly, if a transient having a slope different from a slope of the current waveform is detected, such a transient can also be determined to be an indication of a loose connection. An indication of a loose connection may also be a pulse having a rising and falling flank within a predetermined time interval shorter than a half period of the fundamental frequency. Analysis of the received waveform can for example comprise performing FFT-analysis to determine the frequency content of the waveform.

Moreover, it may also be an indication of a loose connection if a predetermined number of fast pulses are identified within a certain time period, for example within a number of periods of the waveform. As an example, if several fast pulses occur within 1/10 of a second, it is an indication of a loose connection. The distortion is optionally logged in a subsequent step S5 for further analysis. In a next step S6, it is determined if a magnitude of distortions caused by a loose connection exceed a first threshold value. Such a magnitude is a combination of duration and amplitude of the distortion. The magnitude of the distortion is defined as the duration of the distortion evaluated together with the amplitude of the distortion to make quantitative determination of the magnitude of the distortion. For example, a distortion having a low amplitude, i.e. significantly lower than the maximum voltage of the received waveform, which might be the result of flicker in the mains supply, can be acceptable for at least a full period or longer. A high voltage glitch which can be several times higher than the mains voltage can on the other hand only be accepted for a few ms until the distortion becomes potentially dangerous for the system. In practice, a bad connection will often result in a few high voltage glitches with a rise/fall time which corresponds to MHz, and the system can shut down the charging current in less than 1 ms, regardless of the fundamental frequency.

Furthermore, if the magnitude of a distortion exceeds a first threshold value while being below a second threshold value, an alert is provided. The alert may be provided through e.g. a charger interface in the vehicle or in the cable itself, or to a remote portable electronic device such as a smartphone or an electronic key of the vehicle.

However, if also a second threshold value is exceeded in step S7, the external power supply is electrically disconnected from the energy storage device in the vehicle to avoid potential damage components of the charging system. The electrical disconnecting of the power supply is performed using a relay arranged in the vehicle. Alternatively, the method may comprise a step of pausing, or rebooting and restarting a charging operation of the energy storage device by the external power supply as a response to detecting a loose connection having a magnitude exceeding a predetermined threshold value. The above mentioned actions related to detecting a loose connection exceeding the second threshold may also be combined.

The method may also be configured for detecting a loose connection between a direct current power supply and an energy storage device. The detection of a distortion in a received direct current can be performed in a similar manner as described above in relation to an alternating current waveform. For example, if the received waveform comprises any frequency components, it is determined to be distorted, and if a distortion is detected, it is subsequently determined if the distortion is likely to have been caused by a loose connection. Accordingly, method as described with reference to FIG. 2 may equally well be applied both to an alternating current and/or to a direct current received from an external power supply.

Still with reference to FIG. 2, the waveform may optionally be rectified using a full-wave rectifier before it is analyzed. In such case, the fundamental frequency is twice the frequency of the non-rectified waveform.

Furthermore, the waveform may optionally be passed through a low-pass or band-pass filter before it is received. This way, overtones may be filtered away, but depending on the properties of the filter, the frequency components coming from loose connections may still pass the filter.

In another embodiment, the waveform can be passed through a high-pass filter before it is received in step S1. Determining if a distortion S4 is a result of a loose connection then comprises determining an average amplitude of the filtered waveform and determine if the average amplitude exceeds a predetermined threshold value.

Figure 4:
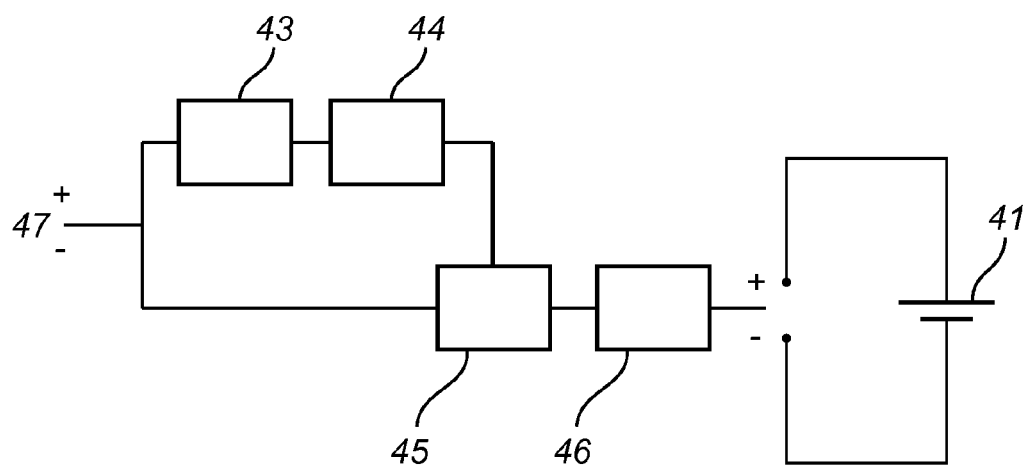
FIG. 4 schematically shows an exemplary embodiment of the system according to the present disclosure.

FIG. 4 schematically illustrates an embodiment of the present disclosure. It illustrates an embodiment of a system 40 in a vehicle for characterizing an electrical connection between an energy storage device 41 of an electrical or hybrid vehicle and an external power supply. In FIG. 4, the system comprises an analog-to-digital converter 43 (ADC), a control unit in the form of a microprocessor 44, a relay 45, and a rectifier 46. During charging of the energy storage device 41, a current waveform is provided by an external power supply at a power inlet 47. The current waveform passes the ADC 43 which may comprise a resistance ladder for down-converting the amplitude of the waveform before it reaches the microprocessor 44. The majority of the current is provided from the power inlet 47 to the relay 45. The microprocessor 44 analyzes the waveform and determines if the waveform is distorted as described above in relation to FIG. 2. Depending on a magnitude of a distortion determined to be caused by a loose connection, the microprocessor may determine to alert a user about a loose connection or to disconnect the external power supply from the battery 41 by switching the relay 45. Here, the energy storage device is a rechargeable battery 41 of a vehicle, and the inlet 47 receives a current waveform from an external power supply. Optionally, a low-pass filter may be arranged between the external power supply 47 and the ADC 43 for blocking overtones other than frequency components resulting from a loose connection.

In various embodiments, still with reference to FIG. 4, a high-pass filter can be arranged as a part of the ADC 43, or as a separate unit arranged between the external power supply 47 and the control unit 44. In an embodiment using a high-pass filter 43, the control unit is configured to determine an average amplitude of the filtered signal. A distortion may be determined to be a result of a loose connection if a detected average amplitude of the filtered signal exceeds a predetermined threshold value.

Additionally, variations to the disclosed embodiments can be understood and effected by the skilled person in practicing the claimed disclosure, from a study of the drawings, the disclosure, and the appended claims. For example, the present disclosure is equally applicable to a charging system connected to a three-phase power supply. The described method may then be applied to all three of the connected phases. Moreover, the relay as described in the system may be any controllable relay suitable for the application.

Thus, while there have been shown and described and pointed out fundamental novel features of the embodiments herein, it will be understood that various omissions and substitutions and changes in the form and details of the devices illustrated, and in their operation, may be made by those skilled in the art. For example, it is expressly intended that all combinations of those elements and/or method steps which perform substantially the same function in substantially the same way to achieve the same results are equivalent. Moreover, it should be recognized that structures and/or elements and/or method steps shown and/or described in connection with any disclosed form or embodiment herein may be incorporated in any other disclosed or described or suggested form or embodiment as a general matter of design choice. The mere fact that certain measures are recited in mutually different dependent claims does not indicate that a combination of these measured cannot be used to advantage.

While exemplary embodiments are described above, it is not intended that these embodiments describe all possible forms of the present disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A method for characterizing an electrical connection between an energy storage device of an electrical or hybrid vehicle and an external power supply, said method comprising:
   in said vehicle, receiving an alternating waveform from said power supply;
   determining a fundamental frequency of said waveform;
   determining that said waveform is distorted if a frequency of said waveform is different from said fundamental frequency, or if transients or pulses deviating from the fundamental frequency are detected in said waveform; and
   if it is determined that said waveform is distorted, integrating a portion of said waveform,
   determining an average amplitude of said integrated portion, and
   if a difference between said average amplitude exceeds a reference amplitude, determining that the waveform is distorted and that said distortion is an indication of a loose connection between said vehicle and said power supply; and if a transient of said waveform is identified, and if said transient has a slope different from a slope of said waveform at said fundamental frequency, determining that said distortion is an indication of a loose connection between said vehicle and said power supply.

2. The method according to claim 1, further comprising identifying a pulse of said waveform having a rising flank and a falling flank, and determining that said pulse is a result of a loose connection if said rising flank and said falling flank occur within a predetermined time interval shorter than a half period of said fundamental frequency.

3. The method according to claim 1, further comprising identifying a plurality of pulses of said waveform, each pulse having a rising flank and a falling flank, and determining that said plurality of pulses is a result of a loose connection if more than a predetermined number of said pulses are identified within a predetermined time interval.

4. The method according to claim 1, wherein, if said waveform comprises a frequency component higher in frequency than said fundamental frequency of said waveform, it is determined that said frequency component is an indication of a loose connection.

5. The method according to claim 1, further comprising sampling said waveform using a predefined sampling frequency.

6. The method according to claim 1, further comprising providing an alert signal if a magnitude of a distortion resulting from a loose connection exceeds a first threshold value.

7. The method according to claim 1, further comprising electrically disconnecting said power supply from said energy storage device if a magnitude of a distortion resulting from a loose connection exceeds a second threshold value, higher than said first threshold value.

8. A system in a vehicle for characterizing an electrical connection between an energy storage device of an electrical or hybrid vehicle and an external power supply, said system comprising:
   a control unit configured to receive an alternating current waveform from said power supply, said control unit being configured to determine a fundamental frequency of said waveform,
   a relay unit arranged to receive said current waveform from said power supply and, depending on a control signal received from said control unit, configured to control a supply of said current waveform from said power supply to said energy storage device, and
   a rectifier unit, connected between said relay unit and said energy storage device, configured to receive said current waveform from said relay unit, rectify said current waveform, and to deliver said rectified current to said energy storage device;

wherein said control unit is configured to detect a distortion of said waveform if a frequency of said waveform is different from said fundamental frequency, or if transients or pulses deviating from the fundamental frequency are detected in said waveform, and wherein said control unit is further configured to, if a distortion is detected, integrating a portion of said waveform, determine an average amplitude of said integrated portion, and if a difference between said average amplitude exceeds a reference amplitude, determine that the waveform is distorted and that the detected distortion is an indication of a loose connection between said vehicle and said power supply; and if a transient of said waveform is identified, and if said transient has a slope different from a slope of said waveform at said fundamental frequency, determine that a detected distortion is an indication of a loose connection between said vehicle and said power supply.

9. The system according to claim 8, wherein said control unit is further configured to identify a pulse of said waveform having a rising flank and a falling flank, and to determine that said pulse is a result of a loose connection if said rising flank and said falling flank occur within a predetermined time interval shorter than a half period of said fundamental frequency.

10. The system according to claim 8, wherein said control unit is further configured to identify a plurality of pulses of said waveform, each pulse having a rising flank and a falling flank, and to determine that said plurality of pulses are a result of a loose connection if more than a predetermined number of said pulses are identified within a predetermined time interval.

11. The system according to any claim 8, further comprising a high-pass filter arranged to receive said current waveform from said power supply, said high-pass filter being configured to block frequencies equal to or lower than said fundamental frequency and to provide a resulting filtered signal to said control unit;
   wherein said control unit is configured to determine an average amplitude of said filtered signal, and to determine that said received current waveform is distorted as a result of a loose connection if said average amplitude of said filtered signal exceeds a predetermined threshold value.

12. The system according to claim 8, further comprising an analog-to-digital converter configured to convert an analog alternating current waveform received from said power supply into a digital waveform using a predefined sampling frequency, and to provide said digital waveform to said control unit.

* * * * *